(12) United States Patent
Chen et al.

(10) Patent No.: US 7,558,149 B2
(45) Date of Patent: Jul. 7, 2009

(54) METHOD AND APPARATUS TO CONTROL SENSING TIME FOR NONVOLATILE MEMORY

(75) Inventors: Chung Kuang Chen, Taipei (TW); Ful-Long Ni, Hsinchu (TW); Yi-Te Shih, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 382 days.

(21) Appl. No.: 11/614,791

(22) Filed: Dec. 21, 2006

(65) Prior Publication Data

US 2007/0171762 A1 Jul. 26, 2007

Related U.S. Application Data

(60) Provisional application No. 60/761,652, filed on Jan. 24, 2006.

(51) Int. Cl.
*G11C 8/00* (2006.01)

(52) U.S. Cl. ............. 365/233; 365/185.21; 365/185.24; 365/185.25; 365/222

(58) Field of Classification Search ............. 365/185.21, 365/185.24, 185.25, 189.01, 222, 233
See application file for complete search history.

(56) References Cited

U.S. PATENT DOCUMENTS

| 5,978,286 A | 11/1999 | Chang et al. |
| 6,108,266 A | 8/2000 | Weier et al. |
| 6,191,977 B1 | 2/2001 | Lee |
| 6,504,789 B2 | 1/2003 | Hirakawa |
| 6,636,440 B2 | 10/2003 | Maayan et al. |
| 6,728,819 B2 | 4/2004 | Farmwald et al. |
| 6,885,610 B2 | 4/2005 | Takayanagi |
| 7,142,464 B2 * | 11/2006 | Dadashev ............... 365/189.09 |
| 2001/0048609 A1 | 12/2001 | Hikida |

* cited by examiner

*Primary Examiner*—VanThu Nguyen
(74) *Attorney, Agent, or Firm*—Kenta Suzue; Haynes Beffel & Wolfeld LLP

(57) ABSTRACT

One or more clock signals are used to control sense amplifier measurements. For example, multiple threshold voltage measurement types characterize the multiple clock signals, and selecting the appropriate clock signal selects the appropriate measurement type. In another example, multiple clock signals control multiple measurements of a particular location of nonvolatile memory, so that one of multiple clock signals is selected or the appropriate clock signal is generated to apply an appropriate threshold voltage window sensitivity.

63 Claims, 8 Drawing Sheets

METHOD AND APPARATUS TO CONTROL SENSING TIME FOR NONVOLATILE MEMORY

REFERENCE TO RELATED APPLICATION

This application claims the benefit of U.S. Provisional Patent Application No. 60/761,652, filed 24 Jan. 2006 by inventors Chung Kuang Chen, Ful-Long Ni and Yi-Te Shih, entitled Method and Apparatus for Power on Refresh Flash.

BACKGROUND OF THE INVENTION

1. Field of the Invention

This invention relates to nonvolatile memory, and in particular to sense amplifier timing for reading nonvolatile memory.

2. Description of Related Art

Measurements of nonvolatile memory typically rely on a sense amplifier to compare a voltage or current from the nonvolatile memory against a reference voltage or current. A read reference level will typically be positioned to keep the sensing window for an inter-logical level. For example, if a lower range of threshold voltages represents a first logical value, such as "1", and an upper range of threshold voltages represents a second logical value, such as "0", then the read reference level might be positioned in the widow between those the upper and lower ranges. However, a refresh reference level might be positioned between the read reference level and the minimum of the upper range; and another refresh reference level might be positioned between the read reference level and the maximum of the lower range. A disagreement between measurements using the read reference level and the refresh reference level indicates the need to refresh a memory cell which is supposed to store a logical value corresponding to the upper range or the lower range. A program verify reference level might be positioned at the minimum of the upper range. An erase verify reference level might be positioned at the maximum of the lower range.

Additionally, if a nonvolatile memory cell location stores multiple bits, then more than two threshold voltage ranges exist. Consequently, a nonvolatile memory cell characterized by multi-level storage has a read reference level, a refresh reference level, a program verify level, and an erase verify level for every inter-logical level window, between any two neighboring threshold voltage ranges.

The existence of several different reference levels, varying with threshold measurement type (e.g., threshold window sensitivity and inter-logical level window), complicates sense amplifier circuitry design, as reference circuitry specific to each reference level must be connected to the sense amplifier circuitry.

Therefore, it would be desirable to simplify the circuitry that generates the various reference levels for sense amplifier circuitry.

SUMMARY OF THE INVENTION

One aspect of the technology is a nonvolatile memory integrated circuit that comprises a nonvolatile memory array storing data, measurement circuitry, and control circuitry. The measurement circuitry is coupled to the nonvolatile memory array to measure a sensing node representing the data, and includes at least one sense amplifier. The control circuitry is coupled to at least one sense amplifier. The control circuitry generates at least one of the multiple clock signals; and the control circuitry selects a clock signal of the multiple clock signals to control a measurement performed by the sense amplifier of data stored in the nonvolatile memory array. Multiple threshold voltage measurement types characterize the multiple clock signals, and each of the threshold voltage measurement types corresponds to a particular timing of at least one of the multiple clock signals.

Another aspect of the technology is a method of operating amplifier circuitry for nonvolatile memory, comprising:

selecting a clock signal of a multiple clock signals to control a measurement performed by a sense amplifier of data stored in a nonvolatile memory array. Multiple threshold voltage measurement types characterize the multiple clock signals, and each threshold voltage measurement type corresponds to a particular timing of at least one of the multiple clock signals.

In some embodiments, the particular timing controls a discharge duration of a sensing node representing the data.

In some embodiments, the sense amplifier performs the multiple threshold voltage measurement types by comparison against a common reference voltage.

In some embodiments, the multiple threshold voltage measurement types are characterized by multiple inter-logical level windows. For example, three inter-logical level windows separate four logical levels, such that each particular location of the nonvolatile memory array stores one of the four logical levels. In one embodiment, each logical level is less than about 400 mV wide.

In some embodiments, the multiple threshold voltage measurement types are characterized by multiple threshold voltage window sensitivities. For example, a first sensitivity determines whether to refresh the data, and a second sensitivity determines a logical value of the data. In another example, a first sensitivity is associated with program verify of the data, and a second sensitivity determining a logical value of the data. In yet another example, a first sensitivity is associated with erase verify of the data, and a second sensitivity determines a logical value of the data. In a further example, a first sensitivity is associated with a low edge of the sensing window of the data and a third sensitivity determines a logical value of the data. In yet a further example, a first sensitivity is associated with a program verify value of the data, a second sensitivity is associated with an erase verify value of the data, and a third sensitivity determines a logical value of the data.

In some embodiments, the data is represented by a threshold voltage characterizing a particular location of the nonvolatile memory array.

In some embodiments, a refresh detect and refresh of at least part of the array occur upon power on of the integrated circuit.

Yet another aspect of the technology is a nonvolatile memory integrated circuit, comprising a nonvolatile memory array storing data, measurement circuitry, and control circuitry. The measurement circuitry is coupled to the nonvolatile memory array to measure a sensing node representing the data, and includes at least one sense amplifier. The control circuitry is coupled to at least one sense amplifier. The control circuitry controls, with a plurality of clock signals, multiple sense amplifier measurements of data stored in a particular location of the nonvolatile memory array. Multiple threshold voltage window sensitivities characterize the multiple sense amplifier measurements, and each of the multiple threshold voltage window sensitivities corresponds to a particular timing of at least one of the multiple clock signals.

A further aspect of the technology is a method of operating sense amplifier circuitry for nonvolatile memory, comprising:

controlling, with multiple clock signals, multiple sense amplifier measurements of data stored in a particular location of a nonvolatile memory array. Multiple threshold voltage window sensitivities characterize the multiple sense amplifier measurements, and each of the multiple threshold voltage window sensitivities corresponds to a particular timing of at least one of the multiple clock signals.

In some embodiments, the particular timing controls a discharge duration of a sensing node representing the data.

In some embodiments, the multiple sense amplifier measurements are performed by comparison against a common reference voltage regardless of the multiple threshold voltage window sensitivities.

In various examples, the multiple sensitivities perform various functions, as follows. A first sensitivity determines whether to refresh the data, and a second sensitivity determines a logical value of the data. A first sensitivity is associated with program verify of the data, and a second sensitivity determines a logical value of the data. A first sensitivity is associated with erase verify of the data, and a second sensitivity determines a logical value of the data. A first sensitivity and a second sensitivity determine whether to refresh the data, and a third sensitivity determines a logical value of the data. A first sensitivity is associated with a high edge of the sensing window of the data, and a second sensitivity is associated with a low edge of the sensing window of the data and a third sensitivity determines a logical value of the data. A first sensitivity is associated with a program verify value of the data, a second sensitivity is associated with an erase verify value of the data, and a third sensitivity determines a logical value of the data.

In some embodiments, the threshold voltage window sensitivities are associated with an inter-logical level window. Alternatively, the multiple threshold voltage window sensitivities are associated with multiple inter-logical level windows.

In some embodiments, the data is represented by a threshold voltage characterizing the particular location of the nonvolatile memory array.

In some embodiments, the data is represented by a threshold voltage in one of four logical levels each at least about 400 mV wide.

In some embodiments, the particular location of the nonvolatile memory array is a data storage location of a charge trapping memory cell. In one example, the particular location is a data storage location of a nanocrystal memory cell. In another example, the particular location is a data storage location of a programmable resistive memory cell.

In some embodiments, at least one sense amplifier includes one sense amplifier performing the multiple sense amplifier measurements. Alternatively, at least one sense amplifier includes multiple sense amplifiers performing the multiple sense amplifier measurements.

In some embodiments, the refresh detecting and refresh operating are done when chip power on

DETAILED DESCRIPTION

Figure 1:
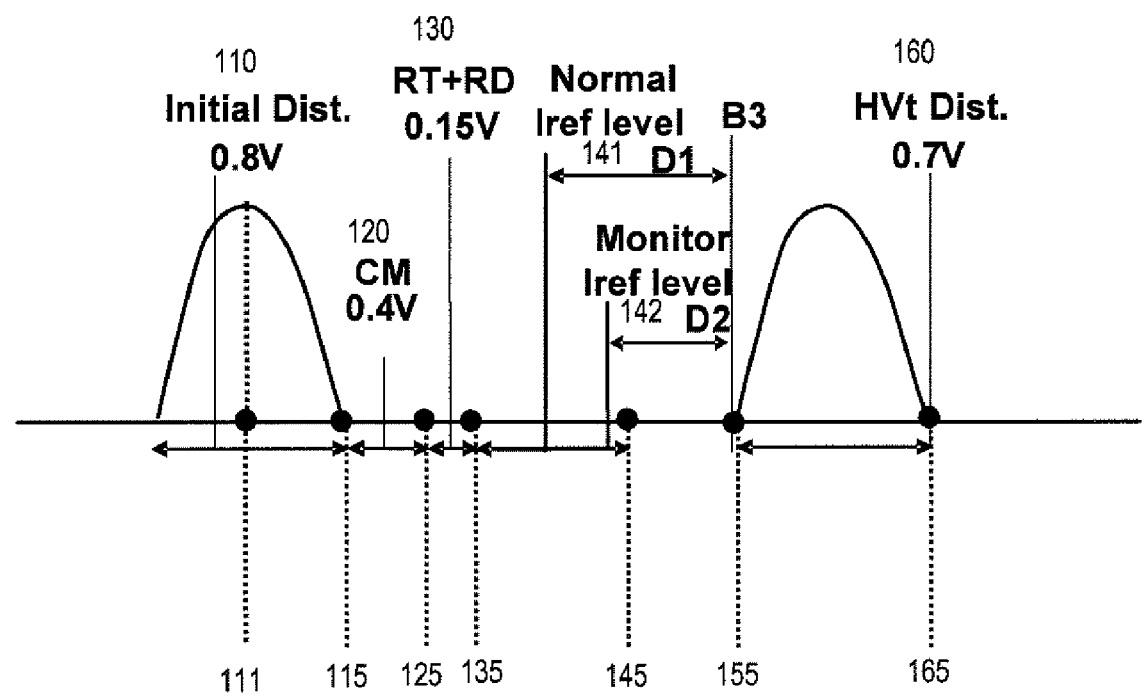
FIG. 1 shows a threshold voltage design algorithm for a nonvolatile memory cell with narrower charge loss margin by using both the normal Iref and the monitor Iref.

FIG. 1 shows a threshold voltage design algorithm for a nonvolatile memory cell with a narrow charge loss margin. 155 is the low bound of the threshold voltage distribution of the data array. 110 is the cell initial distribution. 111 is the middle value of the initial threshold voltage. 115 is the initial threshold voltage high bound. 120 is the low threshold voltage cycling margin. 130 is the threshold voltage room temperature drift and read disturb. 155 is the high threshold voltage distribution low bound. 160 is the threshold voltage of the programmed cells. 165 is the high threshold voltage distribution high bound. 141 is the normal current reference margin D1, and corresponds to a wider charge loss margin. 142 is the monitor current reference margin, D2, and has a narrower window than the normal current reference level 141. Thus, a failure to retain charge is detected sooner. The narrower margin therefore controls the refresh time of the memory cell. The table below shows the threshold voltages corresponding to different points along the voltage axis. According to this algorithm, a data cell doesn't need to keep a large charge loss margin for a long time. With the algorithm, the data cell can keep a smaller cycling margin and improve the nonvolatile memory cell operating window. Monitor_Iref_2 level can be tuned to monitor the C.M. & R.T.+R.D. window, to narrow this window, and improve the operating window. The refresh action includes program and erase functions that are dependent on if the programmed cell undergoes charge loss and the erased cell undergoes charge gain.

| Ref # | Margin Mode 15 μA | Target Device 1 μA Vth |
|---|---|---|
| 111 | 3.05 V | 1.90 V |
| 115 | 3.45 V | 2.3 V |
| 125 | 3.85 V | 2.7 V |
| 135 | 4.0 V | 2.85 V |
| 145 | 4.7 V | 3.55 V |
| 155 | 4.9 V | 3.75 V |
| 165 | 5.6 V | 4.45 V |

Figure 2:
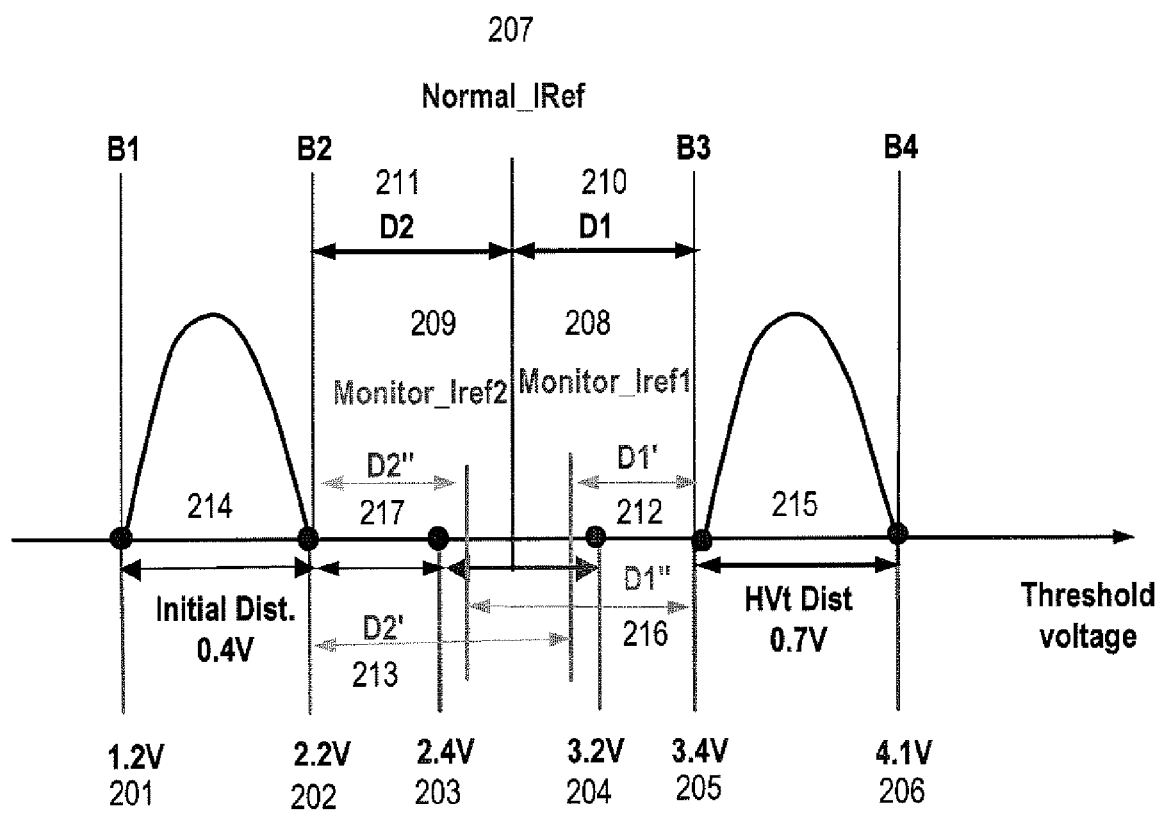
FIG. 2 shows a threshold voltage distribution for nonvolatile memory cells with narrower charge loss margin and narrower CM+RT+RD margin by using the normal_Iref, monitor_Iref1, and monitor_Iref2.

FIG. 2 shows a threshold voltage distribution of memory cells, 201 is the low bound of the low threshold voltage distribution B1. 202 is the high bound of the low threshold voltage distribution B2. 205 is the low bound of the high threshold voltage distribution B3. 206 is the high bound of the high threshold voltage distribution B4. A normal sense amplifier will sense the memory data by using a normal_Iref 207 and have a margin D1 210 for charge loss of high threshold voltage cells and margins D2 211 for charge gain of low threshold voltage cells. Without the refreshing, the memory needs to leave a large window so memory cells can have charge loss or charge gain, for example after 10 K cycles and 10 years. This design suffers from a wide circuit sensing window, especially for multi-levels in one cell. So memory sensing with added monitor_Iref1 204 and monitor_Iref2 209 can narrow the threshold voltage margin of the memory cell. For example, monitor_Iref1 204 has a narrower sensing margin D1' 202 compared to D1 210 and a wider sensing margin D2' 213 compared to D2 211, so monitor_Iref1 has a smaller sensing window for high threshold voltage cells and a larger sensing window for low threshold voltage cells. Because a high threshold voltage cell fails more easily than a low threshold voltage cell with monitor_Iref1, monitor_Iref1 is used to detect the high threshold voltage margin. After the high threshold voltage of memory cells have some charge loss, the sensing with monitor_Iref1 fails, but the sensing with normal_Iref still passes. If the logic data sensed by normal_Iref is a high threshold voltage, the logic data from sensing with normal_Iref is compared with the first logic data form sensing with monitor_Iref1. If this comparison results in a mismatch, then the memory knows that this memory block of this memory cell needs to perform refreshing. Similarly, monitor_Iref2 209 has a wider sensing margin D1" 216 compared to D1 210 and a narrower sensing margin D2" 217 compared to D2, so monitor_Iref2 has a smaller sensing window for low threshold voltage cells and a larger sensing window for high threshold voltage cells. Because a low threshold voltage cell fails more easily than a high threshold voltage cell with monitor_Iref2, monitor _Iref2 is used to detect the low threshold voltage margin. After the low threshold voltage of memory cells have charge gain, the sensing with monitor_Iref2 fails, but the sensing with normal_Iref still passes. If the logic data sensed by normal_Iref is a low threshold voltage, the logic data from sensing with normal_Iref is compared with the second logic data form sensing with monitor_Iref2. If this comparison results in a mismatch, then the memory knows that this memory block of this memory cell needs to perform refreshing. Monitor_Iref1 and monitor_Iref2 can be used separately or at the same time. For example: if the data='1' then compare with the first logic data, if the data='0' then compare with the second logic data. The description described charge loss from high threshold voltage cells and charge gain in low threshold voltage cells.

Figures 3, 4:
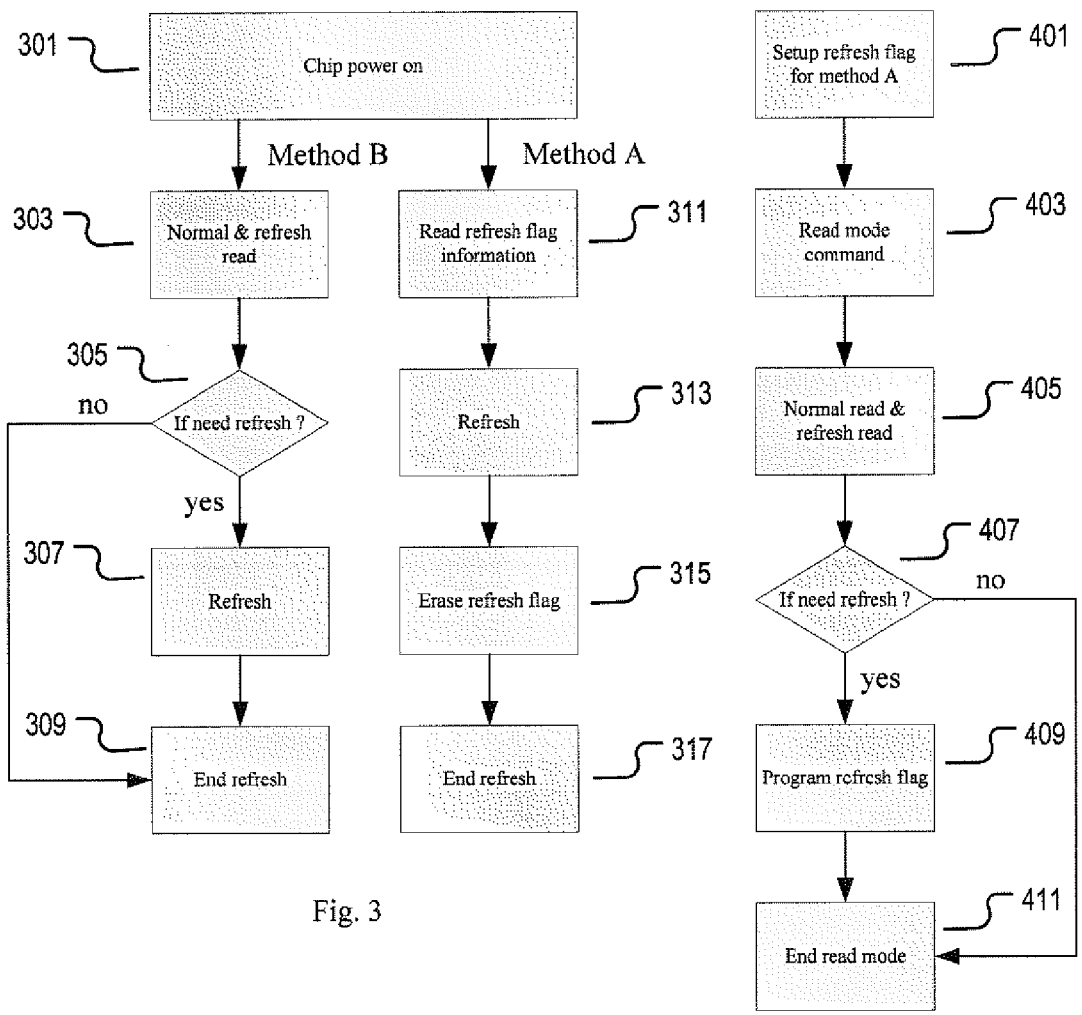
FIG. 3 shows method A and method B to accomplish the power on refresh.
FIG. 4 shows a process to store the refresh flag for method A of FIG. 3.

FIGS. 3 and 4 show a process flow of controlling the refresh function for the chip power on. FIG. 3 shows two methods, Methods A and B. In Method B, chip power on 301 is followed by normal and refresh read 303, and a test of whether refresh is needed 305. If refresh is not needed, then method B ends 309. If refresh is needed, then refresh 307 occurs, and then method B ends 309. In Method A, chip power on 301 is followed by reading the refresh flag information 311, refresh 313, erasing the refresh flag 315, and the end of method A 317. FIG. 4 shows additional information about the refresh flag of Method A of FIG. 3. Setup the refresh flag 401 is followed by read mode command 403, normal read and refresh read 405, and a test of whether refresh is needed 407. If refresh is not needed, then read mode ends 411. If refresh is needed, then the refresh flag is programmed 409, and then read mode ends 411.

FIGS. 5A-5C, 6A-6C, and 7A-7B all illustrate that a particular timing of the clock signal for a sense amplifier determines the measurements type performed by the sense amplifier.

Figure 5:
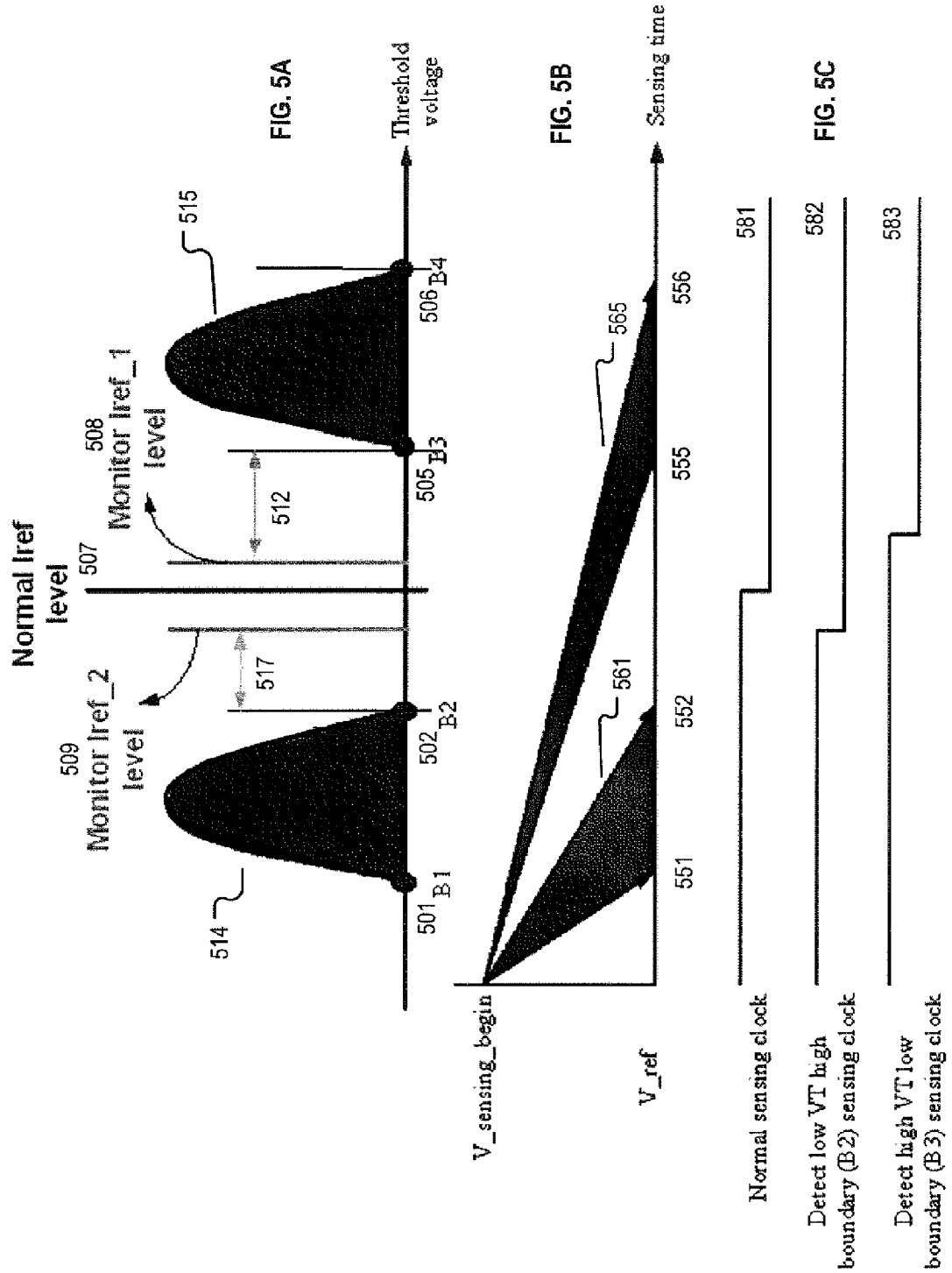
FIG. 5A shows a threshold voltage distribution for nonvolatile memory cells similar to FIG. 2.
FIG. 5B shows a graph of sensing time versus sense node voltage, and accompanies FIG. 5A.
FIG. 5C shows voltage traces of a normal sensing clock and refresh sensing clocks for the upper and lower threshold voltage ranges, and accompanies FIGS. 5B and 5C.

FIG. 5A shows a threshold voltage distribution for non-volatile memory cells similar to FIG. 2. Two logical states are shown—one corresponding to the low threshold voltage distribution 514, and another corresponding to the high threshold voltage distribution 515. 501 is the low bound of the low threshold voltage distribution B1. 502 is the high bound of the low threshold voltage distribution B2. 505 is the low bound of the high threshold voltage distribution B3. 506 is the high bound of the high threshold voltage distribution B4. A normal sense amplifier will sense the memory data by using a normal_Iref 507. Monitor_Iref1 508 and monitor_Iref2 509 narrow the threshold voltage margin of the memory cell. Monitor_Iref1 508 has a narrower sensing margin D1' 512, so monitor_Iref1 has a smaller sensing window for high threshold voltage cells. Monitor_Iref1 if used to detect the high threshold voltage margin. After the high threshold voltage of memory cells have some charge loss, the sensing with monitor_Iref1 fails, but the sensing with normal_Iref still passes. If the logic data sensed by normal_Iref is a high threshold voltage, the logic data form sensing with normal_Iref is compared with the first logic data from sensing with monitor_Iref1. If this comparison results in a mismatch, then the memory knows that this memory block of this memory cell needs to perform refreshing. Similarly, monitor_Iref2 509 has a narrower sensing margin D2" 217, so monitor_Iref2 has a smaller sensing window for low threshold voltage cells. Because a low threshold voltage cell fails more easily than a high threshold voltage cell with monitor_Iref2, monitor_Iref2 is used to detect the low threshold voltage margin. After the low threshold voltage of memory cells have charge gain, the sensing with monitor_Iref2 fails, but the sensing with normal_Iref still passes. If the logic data sensed by normal_Iref is a low threshold voltage, the logic data form sensing with normal_Iref is compared with the second logic data from sensing with monitory_Iref2. If this comparison results in a mismatch, then the memory knows that this memory block of this memory cell needs to perform refreshing. Monitor_Iref1 and monitor_Iref2 can be used separately or at the same time. For example: if the data='1' then compare with the first logic data, if the data='0' then compare with the second logic data. The description described charge loss form high threshold voltage cells and charge gain in low threshold voltage cells.

FIG. 5B shows a graph of sensing time versus sense node voltage, and accompanies FIG. 5A. Prior to each sense amplifier measurement, a sense node voltage of a sense node measured by the sense amplifier is charge to a voltage V_sensing_ begin. During measurement, current through the measured nonvolatile cell changes the value of the sense node voltage towards a target V_ref. The magnitude of the current through the measured nonvolatile cell represents the threshold voltage characterizing the measured nonvolatile cell. The sense node voltage changes to V_ref, if the measured nonvolatile cell is characterized by the threshold voltage shown on FIG. 5A and the current through the measured nonvolatile cell flows for the sensing time shown in FIG. 5B. If, after the particular sensing time has elapsed, comparison of the sense node voltage with V_ref shows the sense node voltage to be between V_sensing_begin and V_ref, then the current flowing through the measured nonvolatile cell was lower than expected, and the threshold voltage characterizing the measured nonvolatile cell was higher in magnitude than expected. Similarly, if, after the particular sensing time has elapsed, comparison of the sense node voltage with V_ref shows the sense node voltage to have changed by more than |V_sensing_begin—V_ref|, then the current flowing through the measured nonvolatile cell was higher than expected, and the threshold voltage characterizing the measured nonvolatile cell was lower in magnitude than expected. Threshold voltage ranges 514 and 515 correspond to sensing time ranges 561 and 565 respectively. Sensing times 551 and 552 correspond to the threshold voltages 501 and 502 respectively. Sensing times 555 and 556 correspond to the threshold voltages 505 and 506 respectively.

FIG. 5C shows voltage traces of a normal sensing clock and refresh sensing clocks for the upper lower threshold voltage ranges, and accompanies FIGS. 5B and 5C. Normal sensing clock 581 corresponds to normal Iref level 507, and determines whether the measured nonvolatile cell has a logical value corresponding to the low threshold voltage distribution 514, or the high threshold voltage distribution 515. Sensing clock 582 to detect a low VT high boundary (B2) corresponds to monitor Iref_2 level 509. Sensing clock 583 to detect a high VT high boundary (B3) corresponds to monitor Iref_1 level 507.

Figure 6:
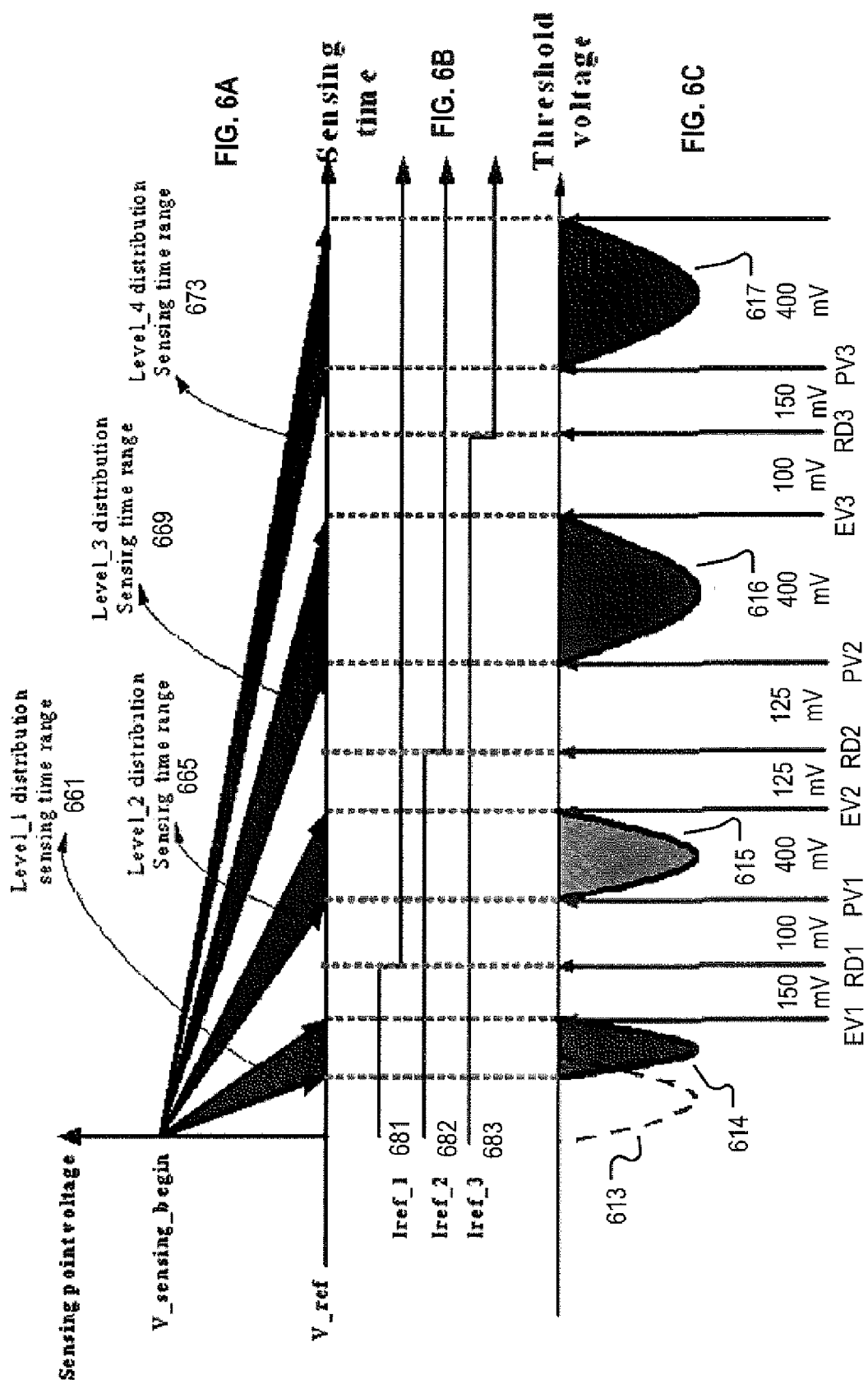
FIG. 6A resembles FIG. 6B, but shows a graph of sensing time versus sense node voltage for a multi-level cell application.
FIG. 6B resembles FIG. 5C, but shows voltage traces of a normal sensing clock for a multi-level cell application, and accompanies FIG. 6A.
FIG. 6C resembles FIG. 5A, but shows a threshold voltage distribution for a multi-level cell application, and accompanies FIGS. 6A and 6B.

FIG. 6A resembles FIG. 5B, but shows a graph of sensing time versus sense node voltage for a multi-level cell application. FIG. 6B resembles FIG. 5C, but shows voltage traces of a normal sensing clock for a multi-level cell application, and accompanies FIG. 6A. FIG. 6C resembles FIG. 5A, but shows a threshold voltage distribution for a multi-level cell application, and accompanies FIGS. 6A and 6B. Threshold voltage ranges 614, 615, 616, and 617 correspond to sensing time ranges 661, 665, 669, and 673 respectively. The threshold voltage ranges are separated by inter-logical level windows. The sensing clocks 681, 682, and 683 each correspond to a distinct inter-logical level window. Sensing clock 681 corresponds to threshold voltage RD1, so distinguishes between threshold voltage distribution 614, and threshold voltage distributions 615, 616, and 617. Sensing clock 682 corresponds to threshold voltage RD2, so distinguishes between threshold voltage distributions 614 and 615, and threshold voltage distributions 616 and 617. Sensing clock 683 corresponds to threshold voltage RD3, so distinguishes between threshold voltage distributions 614, 615, and 616, and threshold voltage distribution 617. FIG. 6C also shows that each inter-logical level window is 250 mV wide, and that each of the threshold voltage distributions 615, 616, and 617 is 400 mV wide. The upper bound of threshold voltage distribution 614 is EV1, 150 mV below RD1. The lower bound of threshold voltage distribution 615 is PV1, 100 mV above RD1. The upper bound of threshold voltage distribution 615 is EV2, 125 mV below RD2. The lower bound of threshold voltage distribution 616 is PV2, 125 mV above RD2. The upper bound of threshold voltage distribution 616 is EV3, 100 mV below RD3. The lower bound of threshold voltage distribution 617 is PV3, 150 mV above RD3. Refresh clocks are not shown, but are present in another embodiment.

Figure 7:
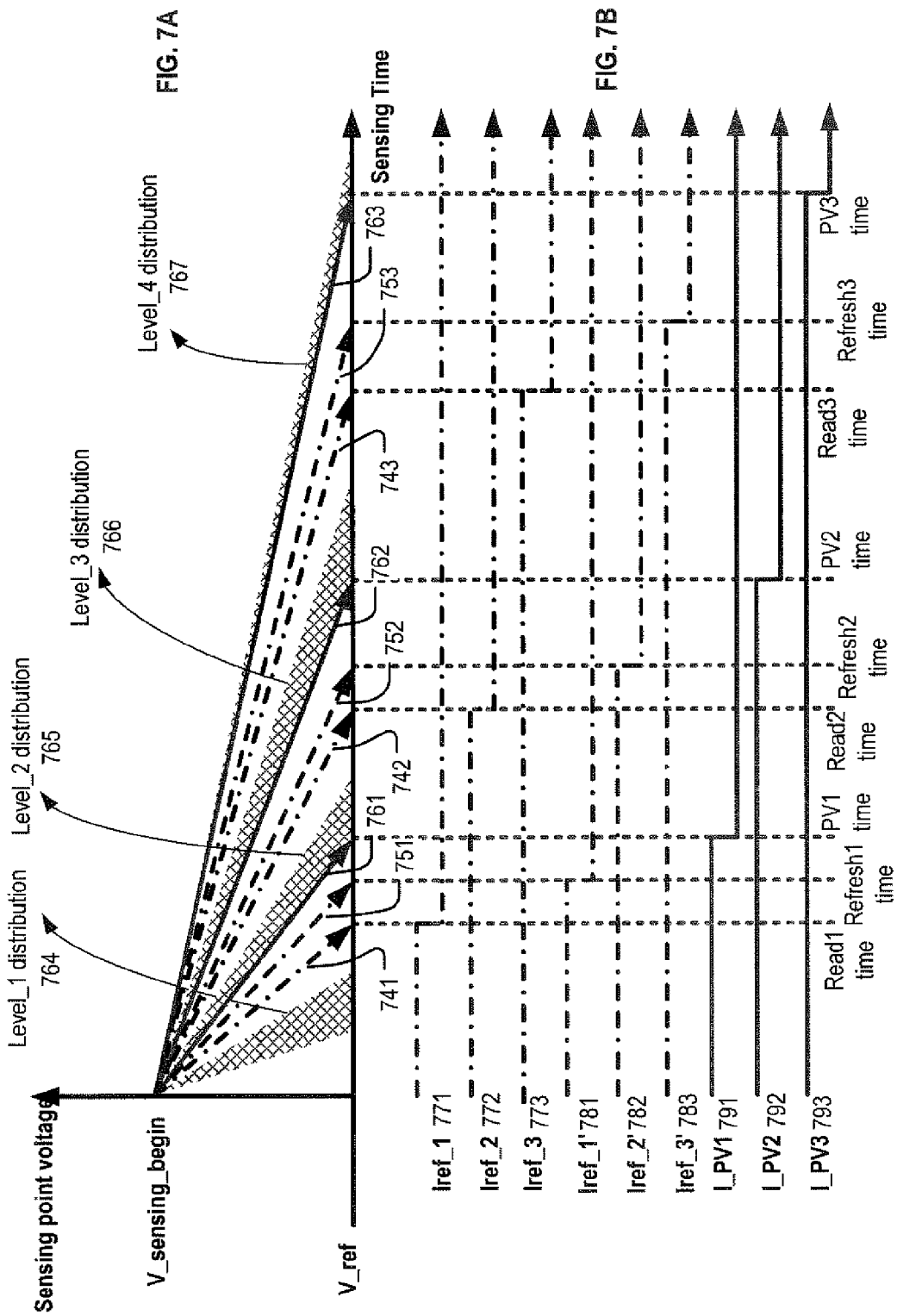
FIG. 7A resembles FIGS. 5B and 6A, but shows a graph of sensing time versus sense node voltage in a multi-level cell application for also refresh times and program verify times.
FIG. 7B resembles FIGS. 6B and 5C, but shows voltage traces for a multi-level cell application for also refresh times and program verify times, and accompanies FIG. 7A.

FIG. 7A resembles FIGS. 5B and 6A, but shows a graph of sensing time versus sense node voltage in a multi-level cell application for also refresh times and program verify times. FIG. 7B resembles FIGS. 6B and 5C, but shows voltage traces for a multi-level cell application for also refresh times and program verify times, and accompanies FIG. 7A. Sensing traces 741, 742, and 743 and their corresponding sensing clocks 771, 772, and 773 are used to distinguish between threshold voltage distributions as discussed in FIGS. 6A-6C. Four distinct threshold voltage distributions are represented by Level_1 distribution 764, Level_2 distribution 765, Level_3 distribution 766, and Level_4 distribution 767. Sensing trace 741 corresponds to sensing clock Iref_1 771 with clock edge at Read1 time. Sensing trace 742 corresponds to sensing clock Iref_2 772 with clock edge at Read2 time. Sensing trace 743 corresponds to sensing clock Iref_3 773 with clock edge at Read3 time. Sensing trace 751 corresponds to sensing clock Iref_1' 781 with clock edge at Refresh1 time. Sensing trace 752 corresponds to sensing clock Iref_2' 782 with clock edge at Refresh2 time. Sensing trace 753 corresponds to sensing clock Iref_3' 783 with clock edge at Refresh3 time. Sensing traces 761, 762, and 763 and their corresponding sensing clocks 791, 792, and 793 are used for program verify. Sensing trace 761 corresponds to sensing clock I_PV1 791 with clock edge at PV1 time. Sensing trace 762 corresponds to sensing clock I_PV2 792 with clock edge at PV2 time. Sensing trace 763 corresponds to sensing clock I_PV3 793 with clock edge at PV3 time. Erase verify clocks and refresh clock for charge gain are not shown, but one or both are present in another embodiment.

Figure 8:
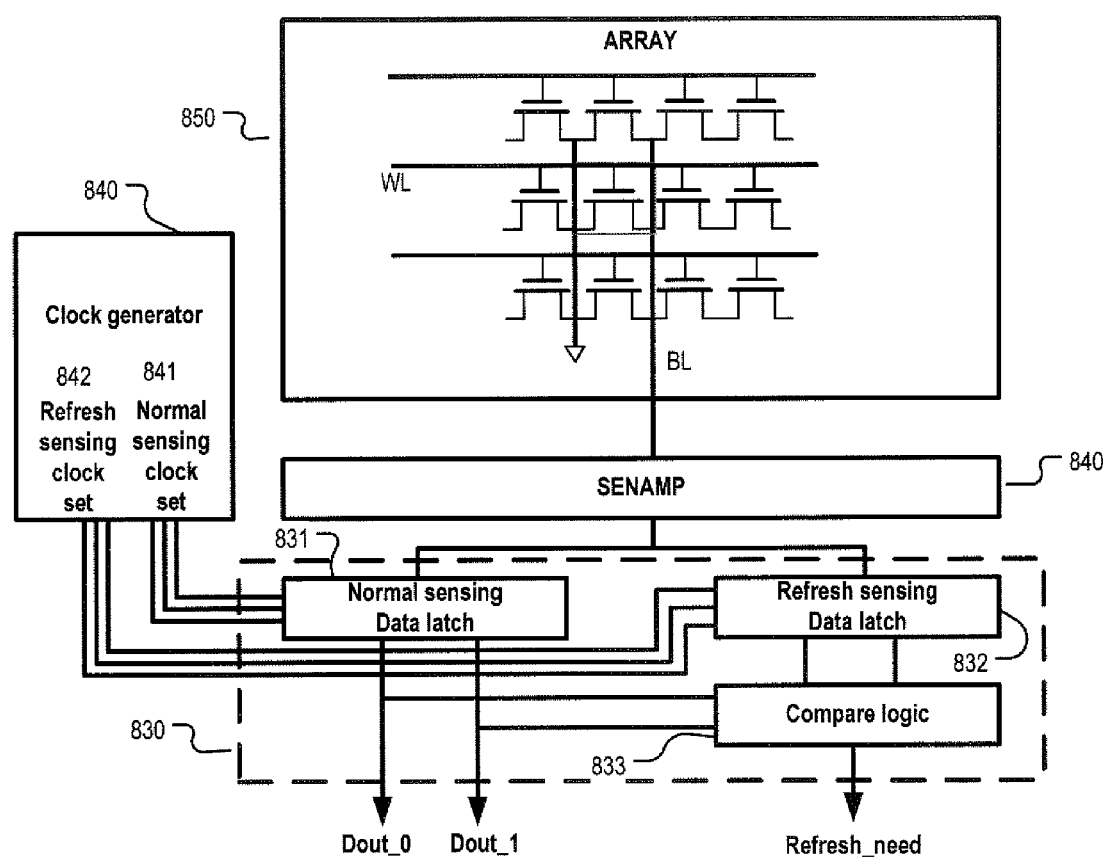
FIG. 8 shows a sample block diagram of an integrated circuit with variable sense amplifier clock timing.

FIG. 8 shows a sample block diagram of an integrated circuit with variable sense amplifier clock timing. Nonvolatile memory array 850 includes a nonvolatile memory cell which is read by applying appropriate voltages to the word line WL and bit line BL. A bit line on one side of the measured cell is grounded. A bit line on the other side oft he measured cell is connected to a sense node, and raised to a starting sensing voltage V_sensing_begin. Clock circuitry such as clock generator 840 determines the duration of current flow through the measured cell. After a sensing time determined by clock generator 840, sense amplifier circuitry 840 compares the sense node voltage to a reference voltage V_ref. The sensing is performed with normal sensing clock set 841, and the result is stored in normal sensing data latch 831, and output as Dout_0 or Dout_1. The sensing is performed with refresh sensing clock set 842, and the result is stored in refresh sensing data latch 832. Compare logic 833 compares the results stored in normal sensing data latch 831 and refresh sensing data latch 832. If the results agree, then signal Refresh_need is output by the compare logic 833.

Figure 9:
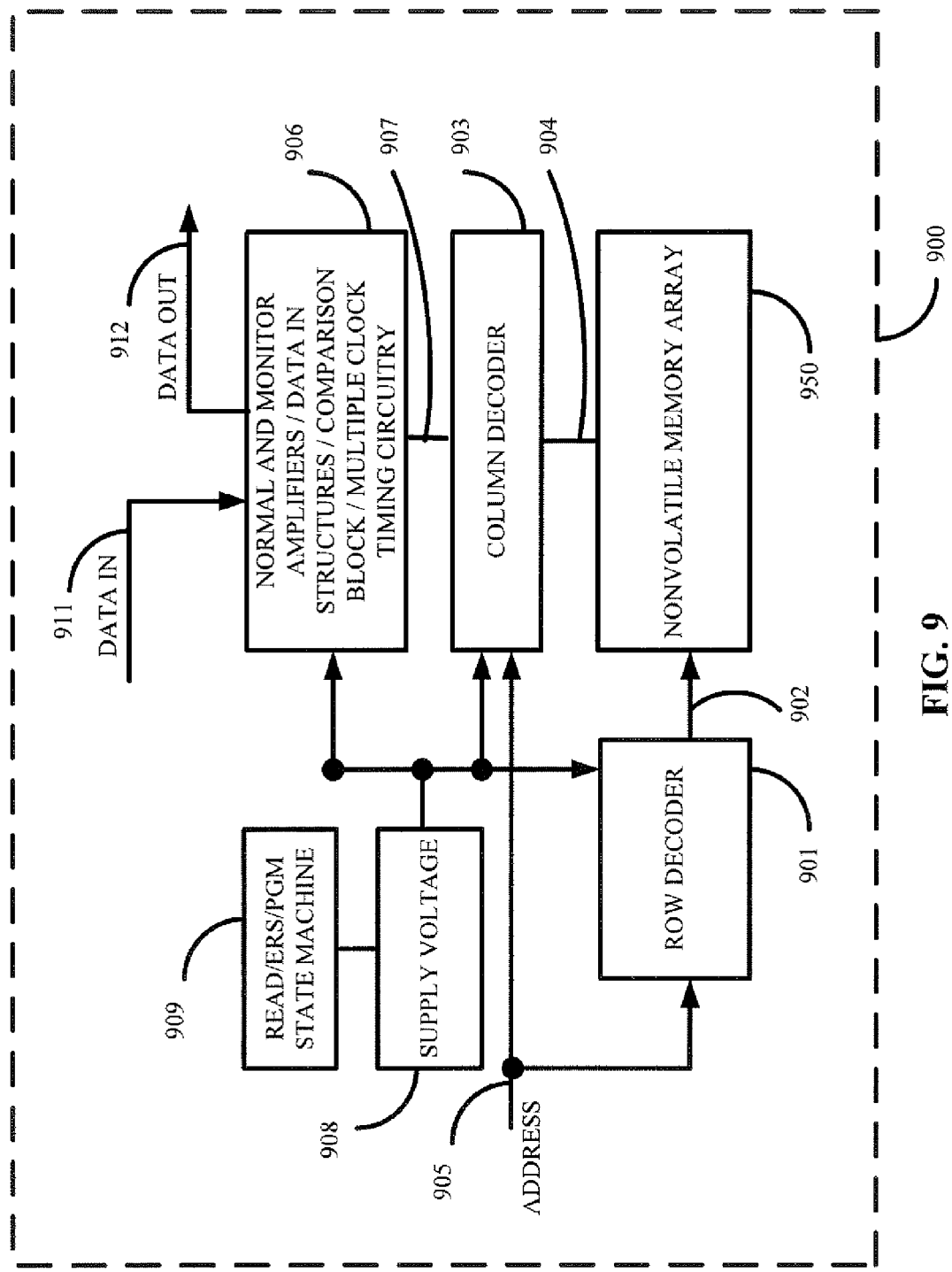
FIG. 9 shows a block diagram for performing parallel sensing to determine whether to perform the refresh function, with both normal sensing clocks and refresh sensing clocks. Normal sensing clocks latch the normal data and refresh sensing clocks latch the refresh reference data.

FIG. 9 is a simplified diagram of an integrated circuit with nonvolatile memory cells and the refresh circuitry. The integrated circuit 900 includes a memory array 950 implemented using data memory cells on a semiconductor substrate. The memory cells of array 950 may be individual cells, interconnected in arrays, or interconnected in multiple arrays. A row decode 901 is coupled to a plurality of word lines 902 arranged along rows in the memory array 950. A column decoder 903 is coupled to a plurality of bit lines 904 arranged along columns in the memory array 950. Addresses are supplied on bus 905 to column decoder 903 and row decoder 901. Normal sense amplifiers, monitor sense amplifiers, comparison block, data-in structures, and multiple clock timing circuitry in block 906 are coupled to the column decoder 903 via data bus 907. Data is supplied via the data-in line 911 from input/output ports on the integrated circuit 900, or from other data sources internal or external to the integrated circuit 900, to the data-in structures in block 906. Multiple clock timing circuitry in block 906 controls various clock timing for the sense amplifiers. Data is supplied via the data-out line 912 from the sense amplifiers in block 906 to input/output ports on the integrated circuit 900, or to other destinations internal or external to the integrated circuit 900.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory integrated circuit, comprising:
    a nonvolatile memory array storing data;
    measurement circuitry coupled to the nonvolatile memory array to measure a sensing node representing the data, including at least one sense amplifier; and
    control circuitry coupled to said at least one sense amplifier, the control circuitry generating at least one clock signal of a plurality of clock signals; and the control circuitry selects a clock signal of the plurality of clock signals to control a measurement performed by the sense amplifier of data stored in the nonvolatile memory array, wherein a plurality of threshold voltage measurement types characterizes the plurality of clock signals, and each threshold voltage measurement type of the plurality of threshold voltage measurement types corresponds to a particular timing of at least one clock signal of the plurality of clock signals.

2. The nonvolatile memory integrated circuit of claim 1, wherein the particular timing controls a discharge duration of a sensing node representing the data.

3. The nonvolatile memory integrated circuit of claim 1, wherein the sense amplifier performs the plurality of threshold voltage measurement types by comparison against a common reference voltage.

4. The nonvolatile memory integrated circuit of claim 1, wherein the plurality of threshold voltage measurement types is characterized by a plurality of inter-logical level windows.

5. The nonvolatile memory integrated circuit of claim 1, wherein the plurality of threshold voltage measurement types is characterized by three inter-logical level windows separating four logical levels, wherein each particular location of the nonvolatile memory array stores one of the four logical levels.

6. The nonvolatile memory integrated circuit of claim 1, wherein the plurality of threshold voltage measurement types is characterized by three inter-logical level windows separating four logical levels, wherein each particular location of the nonvolatile memory array stores on of the four logical levels, and each of the four logical levels is less than about 400 mV wide.

7. The nonvolatile memory integrated circuit of claim 1, wherein the plurality of threshold voltage measurement types is characterized by a plurality of threshold voltage window sensitivities.

8. The nonvolatile memory integrated circuit of claim 1, wherein the plurality of threshold voltage measurement types is characterized by a first sensitivity determining whether to refresh the data, and a second sensitivity determining a logical value of the data.

9. The nonvolatile memory integrated circuit of claim 1, wherein the plurality of threshold voltage measurement types is characterized by a first sensitivity associated with program verify of the data, and a second sensitivity determining a logical value of the data.

10. The nonvolatile memory integrated circuit of claim 1, wherein the plurality of threshold voltage measurement types is characterized by a first sensitivity associated with erase verify of the data, and a second sensitivity determining a logical value of the data.

11. The nonvolatile memory integrated circuit of claim 1, wherein the data is represented by a threshold voltage characterizing a particular location of the nonvolatile memory array.

12. The circuit of claim 1, wherein a refresh detect and refresh of at least part of the array occur upon power on of the integrated circuit.

13. A method of operating sense amplifier circuitry for nonvolatile memory, comprising:
    selecting a clock signal of a plurality of clock signals to control a measurement performed by a sense amplifier of data stored in a nonvolatile memory array, wherein a plurality of threshold voltage measurement types characterizes the plurality of clock signals, and each threshold voltage measurement type of the plurality of threshold voltage measurement types corresponds to a particular timing of at least one clock signal of the plurality of clock signals.

14. The method of claim 13, wherein the particular timing controls a discharge duration of a sensing node representing the data.

15. The method of claim 13, wherein the sense amplifier performs the plurality of threshold voltage measurement types by comparison against a common reference voltage.

16. The method of claim 13, wherein the plurality of threshold voltage measurement types is characterized by a plurality of inter-logical level windows.

17. The method of claim 13, wherein the plurality of threshold voltage measurement types is characterized by three inter-logical level windows separating four logical levels, wherein each particular location of the nonvolatile memory array stores one of the four logical levels.

18. The method of claim 13, wherein the plurality of threshold voltage measurement types is characterized by three inter-logical level windows separating four logical levels, wherein each particular location of the nonvolatile memory array stores one of the four logical levels, and each of the four logical levels is less than about 400 mV wide.

19. The method of claim 13, wherein the plurality of threshold voltage measurement types is characterized by a plurality of threshold voltage window sensitivities.

20. The method of claim 13, wherein the plurality of threshold voltage measurement types is characterized by a first sensitivity determining whether to refresh the data, and a second sensitivity determining a logical value of the data.

21. The method of claim 13, wherein the plurality of threshold voltage measurement types is characterized by a first sensitivity associated with program verify of the data, and a second sensitivity determining a logical value of the data.

22. The method of claim 13, wherein the plurality of threshold voltage measurement types is characterized by a first sensitivity associated with erase verify of the data, and a second sensitivity determining a logical value of the data.

23. The method of claim 13, wherein the data is represented by a threshold voltage characterizing a particular location of the nonvolatile memory array.

24. The method of claim 13, wherein the plurality of threshold voltage measurement types is characterized by a first sensitivity associated with a high edge of a sensing window of the data, and a second sensitivity associated with a low edge of the sensing window of the data and a third sensitivity determining a logical value of the data.

25. The method of claim 13, wherein the plurality of threshold voltage measurement types is characterized by a first sensitivity associated with a program verify value of the data, a second sensitivity associated with an erase verify value of the data, and a third sensitivity determining a logical value of the data.

26. The method of claim 13, wherein the refresh detecting and refresh occur upon chip power on.

27. A nonvolatile memory integrated circuit, comprising:
a nonvolatile memory array storing data;
measurement circuitry coupled to the nonvolatile memory array to measure a sensing node representing the data, including at least one sense amplifier; and
control circuitry coupled to said at least one sense amplifier, the control circuitry controlling, with a plurality of clock signals, a plurality of sense amplifier measurements of data stored in a particular location of the nonvolatile memory array, wherein a plurality of threshold voltage window sensitivities characterizes the plurality of sense amplifier measurements, and each threshold voltage window sensitivity of the plurality of threshold voltage window sensitivities corresponds to a particular timing of at least one clock signal of the plurality of clock signals.

28. The nonvolatile memory integrated circuit of claim 27, wherein the particular timing controls a discharge duration of a sensing node representing the data.

29. The nonvolatile memory integrated circuit of claim 27, wherein the plurality of sense amplifier measurements are performed by comparison against a common reference voltage regardless of the plurality of threshold voltage window sensitivities.

30. The nonvolatile memory integrated circuit of claim 27, wherein the plurality of threshold voltage window sensitivities includes a first sensitivity determining whether to refresh the data, and a second sensitivity determining a logical value of the data.

31. The nonvolatile memory integrated circuit of claim 27, wherein the plurality of threshold voltage window sensitivities includes a first sensitivity associated with program verify of the data, and a second sensitivity determining a logical value of the data.

32. The nonvolatile memory integrated circuit of claim 27, wherein the plurality of threshold voltage window sensitivities includes a first sensitivity associated with erase verify of the data, and a second sensitivity determining a logical value of the data.

33. The nonvolatile memory integrated circuit of claim 27, wherein the plurality of threshold voltage window sensitivities are associated with an inter-logical level window.

34. The nonvolatile memory integrated circuit of claim 27, wherein the plurality of threshold voltage window sensitivities are associated with a plurality of inter-logical level windows.

35. The nonvolatile memory integrated circuit of claim 27, wherein the data is represented by a threshold voltage characterizing the particular location of the nonvolatile memory array.

36. The nonvolatile memory integrated circuit of claim 27, wherein the data is represented by a threshold voltage in one of four logical each at least about 400 mV wide.

37. The nonvolatile memory integrated circuit of claim 27, wherein the particular location of the nonvolatile memory array is a data storage location of a charge trapping memory cell.

38. The nonvolatile memory integrated circuit of claim 27, wherein the particular location of the nonvolatile memory array is a data storage location of a nanocrystal memory cell.

39. The nonvolatile memory integrated circuit of claim 27, wherein the particular location of the nonvolatile memory array is a data storage location of a programmable resistive memory cell.

40. The nonvolatile memory integrated circuit of claim 27, wherein said at least one sense amplifier includes one sense amplifier performing said plurality of sense amplifier measurements.

41. The nonvolatile memory integrated circuit of claim 27, wherein said at least one sense amplifier includes a plurality of sense amplifiers performing said plurality of sense amplifier measurements.

42. The nonvolatile memory integrated circuit of claim 27, wherein the plurality of threshold voltage window sensitivities includes a first sensitivity and a second sensitivity determining whether to refresh the data, and a third sensitivity determining a logical value of the data.

43. The nonvolatile memory integrated circuit of claim 27, wherein the plurality of threshold voltage measurement types is characterized by a first sensitivity associated with a high edge of a sensing window of the data, and a second sensitivity associated with a low edge of the sensing window of the data and a third sensitivity determining a logical value of the data.

44. The nonvolatile memory integrated circuit of claim 27, wherein the plurality of threshold voltage measurement types is characterized by a first sensitivity associated with a program verify value of the data, a second sensitivity associated with an erase verify value of the data, and a third sensitivity determining a logical value of the data.

45. The nonvolatile memory integrated circuit of claim 27, wherein the refresh detecting and refresh operating occur upon chip power on.

46. A method of operating sense amplifier circuitry for nonvolatile memory, comprising:
controlling, with a plurality of clock signals, a plurality of sense amplifier measurements of data sorted in a particular location of a nonvolatile memory array, wherein a plurality of threshold voltage window sensitivities characterizes the plurality of sense amplifier measurements, and each threshold voltage window sensitivity of the plurality of threshold voltage window sensitivities corresponds to a particular timing of at least one clock signal of the plurality of clock signals.

47. The method of claim 46, wherein the particular timing controls a discharge duration of a sensing node representing the data.

48. The method of claim 46, wherein the plurality of sense amplifier measurements are performed by comparison against a common reference voltage regardless of the plurality of threshold voltage window sensitivities.

49. The method of claim 46, wherein the plurality of threshold voltage window sensitivities includes a first sensitivity determining whether to refresh the data, and a second sensitivity determining a logical value of the data.

50. The method of claim 46, wherein the plurality of threshold voltage window sensitivities includes a first sensitivity associated with program verify of the data, and a second sensitivity determining a logical value of the data.

51. The method of claim 46, wherein the plurality of threshold voltage window sensitivities includes a first sensitivity associated with erase verify of the data, and a second sensitivity determining a logical value of the data.

52. The method of claim 46, wherein the plurality of threshold voltage window sensitivities are associated with an inter-logical level window.

53. The method of claim 46, wherein the plurality of threshold voltage window sensitivities are associated with a plurality of inter-logical level windows.

54. The method of claim 46, wherein the data is represented by a threshold voltage characterizing the particular location of the nonvolatile memory array.

55. The method of claim 46, wherein the data is represented by a threshold voltage in one of four logical levels each at least about 400 mV wide.

56. The method of claim 46, wherein the particular location of the nonvolatile memory array is a data storage location of a charge trapping memory cell.

57. The method of claim 46, wherein the particular location of the nonvolatile memory array is a data storage location of a nanocrystal memory cell.

58. The method of claim 46, wherein the particular location of the nonvolatile memory array is a data storage location of a programmable resistive memory cell.

59. The method of claim 46, wherein the plurality of sense amplifier measurements is performed by a sense amplifier.

60. The method of claim 46, wherein the plurality of sense amplifier measurements is performed by a plurality of sense amplifiers.

61. The method of claim 46, wherein the plurality of threshold voltage window sensitivities includes a first sensitivity and a second sensitivity determining whether to refresh the data, and a third sensitivity determining a logical value of the data.

62. The method of claim 46, wherein the plurality of threshold voltage measurement types is characterized by a first sensitivity associated with a high edge of a sensing window of the data, and a second sensitivity associated with a low edge of the sensing window of the data and a third sensitivity determining a logical value of the data.

63. The method of claim 46, wherein the plurality of threshold voltage measurement types is characterized by a first sensitivity associated with a program verify value of the data, a second sensitivity associated with an erase verify value of the data, and a third sensitivity determining a logical value of the data.

* * * * *